(12) United States Patent
Ankamah-Kusi et al.

(10) Patent No.: US 11,978,699 B2
(45) Date of Patent: May 7, 2024

(54) ELECTRONIC DEVICE MULTILEVEL PACKAGE SUBSTRATE FOR IMPROVED ELECTROMIGRATION PREFORMANCE

(71) Applicant: Texas Instruments Incorporated, Dallas, TX (US)

(72) Inventors: Sylvester Ankamah-Kusi, Dallas, TX (US); Yiqi Tang, Allen, TX (US); Rajen Manicon Murugan, Dallas, TX (US); Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 210 days.

(21) Appl. No.: 17/406,150

(22) Filed: Aug. 19, 2021

(65) Prior Publication Data

US 2023/0055211 A1    Feb. 23, 2023

(51) Int. Cl.
*H01L 23/498*       (2006.01)
*H01L 21/48*        (2006.01)
(Continued)

(52) U.S. Cl.
CPC .... *H01L 23/49838* (2013.01); *H01L 21/4857* (2013.01); *H01L 23/49822* (2013.01); *H01L 21/6835* (2013.01); *H01L 24/14* (2013.01); *H01L 24/16* (2013.01); *H01L 24/17* (2013.01); *H01L 24/81* (2013.01); *H01L 2221/68345* (2013.01); *H01L 2224/1416* (2013.01);
(Continued)

(58) Field of Classification Search
CPC .......... H01L 23/49838; H01L 21/4857; H01L 23/49822; H01L 21/6835; H01L 24/14; H01L 24/16; H01L 24/17; H01L 24/81; H01L 2221/68345; H01L 2224/1416; H01L 2224/16225; H01L 2224/17106; H01L 2224/81385; H01L 2224/81815
USPC .......................................................... 257/737
See application file for complete search history.

(56) References Cited

U.S. PATENT DOCUMENTS 7,989,944 B2 *   8/2011  Tuominen ........... H01L 23/5389
                                                 257/E23.005
8,129,226 B2 *   3/2012  Johnston ............. H01L 23/3128
                                                 438/106

(Continued)

OTHER PUBLICATIONS

PCT Search Report PCT/US2002/040587 dated Jan. 19, 2023, 2 pages.

*Primary Examiner* — Vu A Vu
(74) *Attorney, Agent, or Firm* — Ronald O. Neerings; Frank D. Cimino

(57) ABSTRACT

An electronic device includes a multilevel package substrate with first and second levels extending in planes of first and second directions and spaced apart from one another along a third direction, the first level having a first side with landing areas spaced apart from one another along the first direction. The multilevel package substrate includes a conductive structure having first and second ends and conductive portions in the first and second levels that provide a conductive path along the first direction from the landing areas toward the second end, where the conductive structure includes indents that extend into the conductive portions in the first level, the indents spaced apart from one another along the first direction and positioned along the first direction between respective pairs of the landing areas.

20 Claims, 11 Drawing Sheets

(51) Int. Cl.
    *H01L 21/683*    (2006.01)
    *H01L 23/00*    (2006.01)

(52) U.S. Cl.
    CPC .............. *H01L 2224/16225* (2013.01); *H01L 2224/17106* (2013.01); *H01L 2224/81385* (2013.01); *H01L 2224/81815* (2013.01)

(56) References Cited

U.S. PATENT DOCUMENTS

| | | | | |
|---|---|---|---|---|
| 8,922,005 | B2* | 12/2014 | Hu | ........................ H01L 25/105 |
| | | | | 257/737 |
| 9,107,290 | B1* | 8/2015 | Chen | ..................... H05K 3/0061 |
| 9,466,631 | B2* | 10/2016 | Fallica | .............. H01L 27/14618 |
| 10,068,874 | B2* | 9/2018 | Nelson | .................... H01L 25/50 |
| 10,153,177 | B2* | 12/2018 | Sorimachi | ......... H01L 23/49838 |
| 10,262,932 | B2* | 4/2019 | Furuichi | .............. H01L 21/6835 |
| 10,905,005 | B2* | 1/2021 | Taneda | ................. H05K 1/0271 |
| 2010/0212947 | A1 | 8/2010 | Yamanaka et al. | |
| 2016/0066423 | A1 | 3/2016 | Sakamopto et al. | |
| 2020/0211971 | A1 | 7/2020 | Mizutani | |
| 2021/0143103 | A1* | 5/2021 | Mrad | ................ H01L 23/49833 |

* cited by examiner

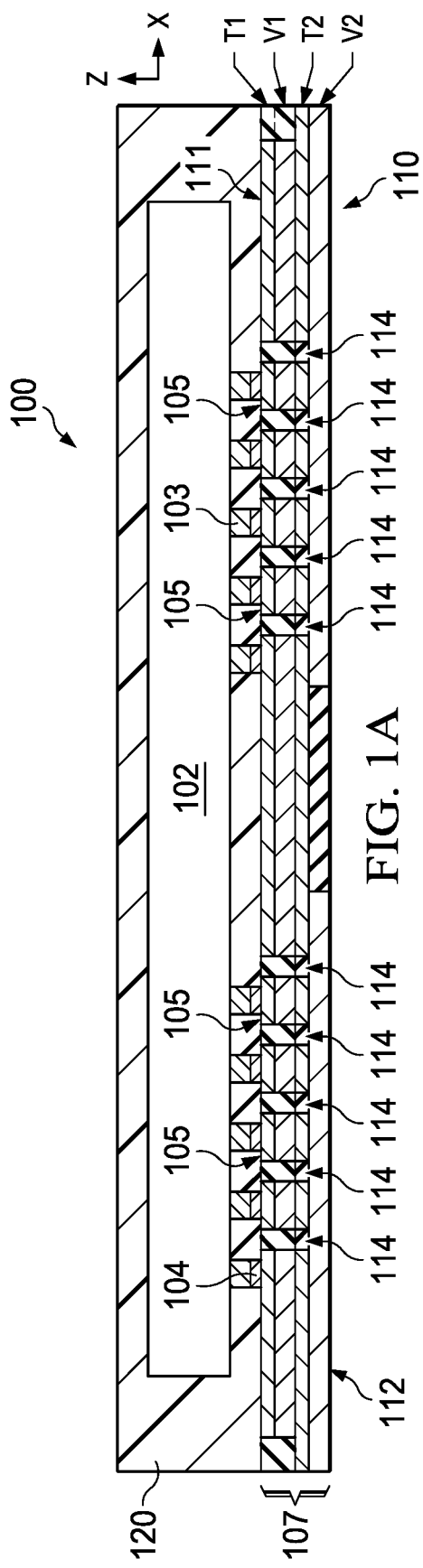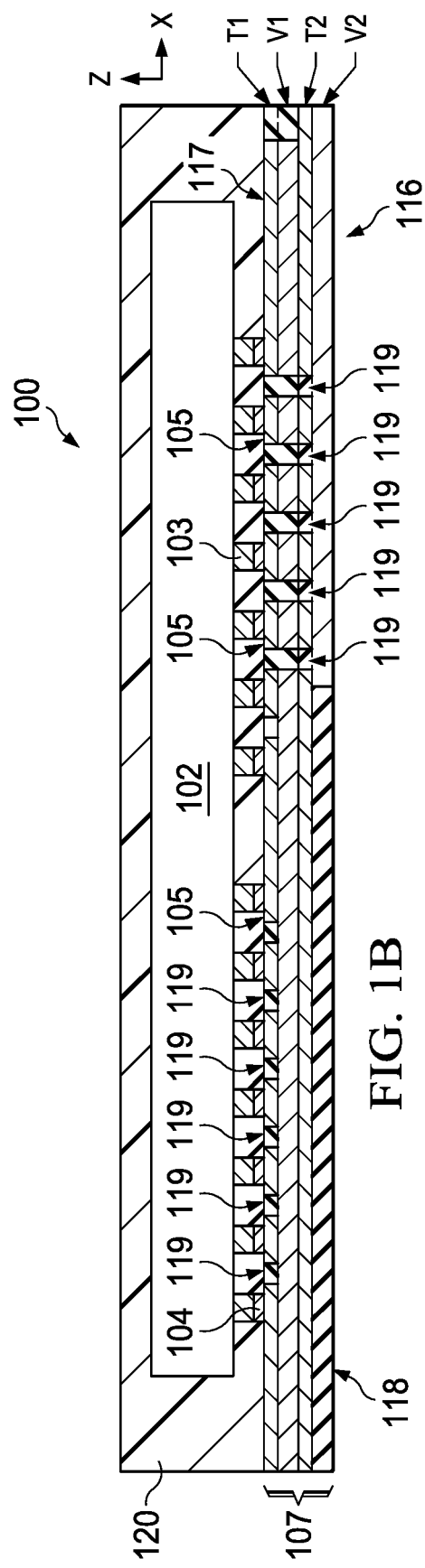

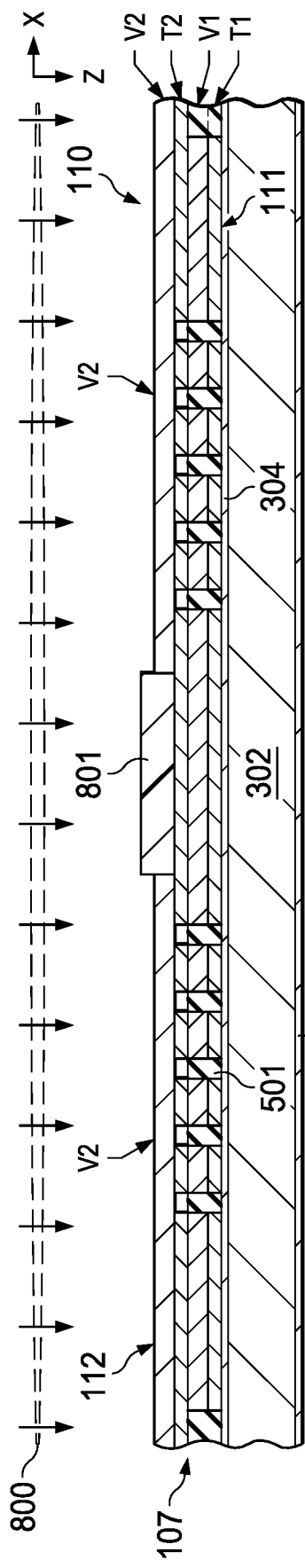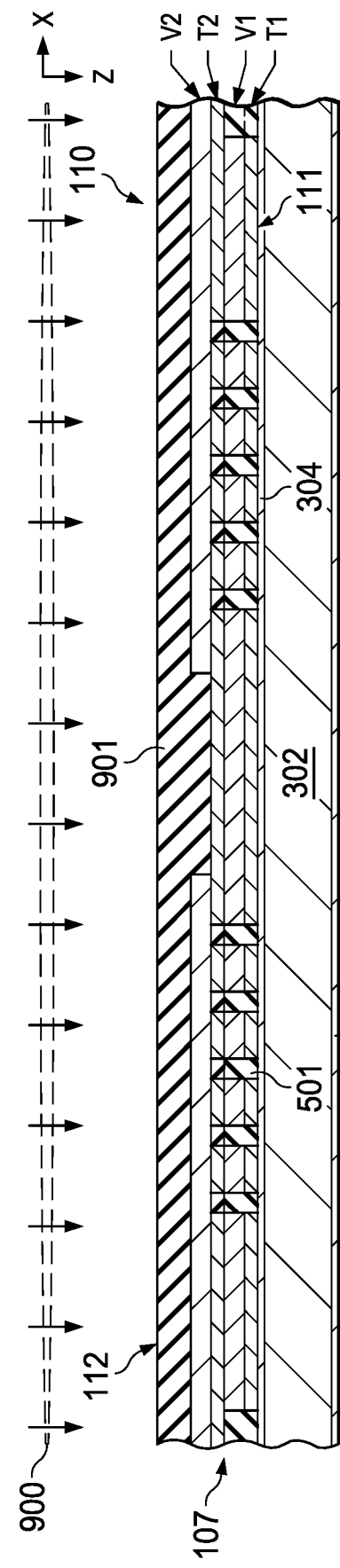

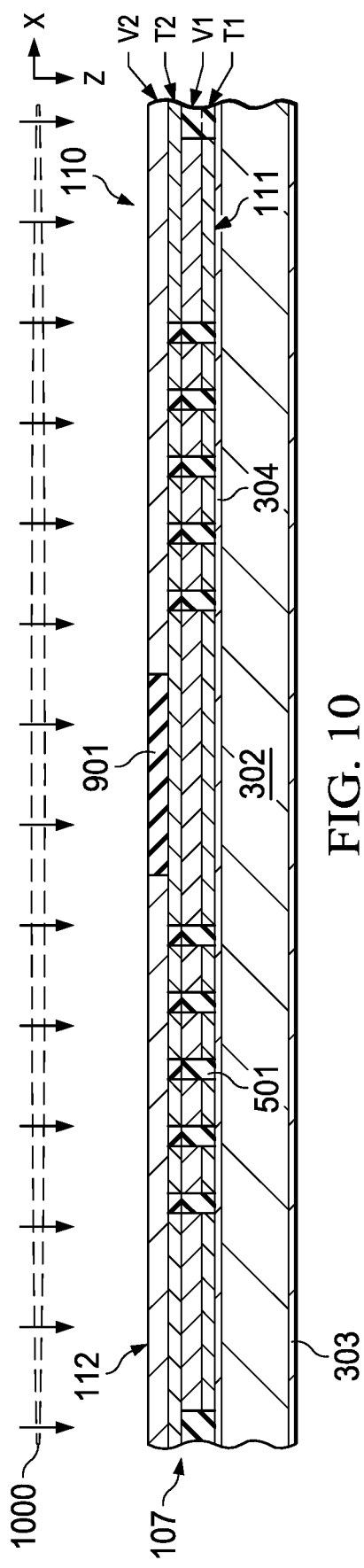
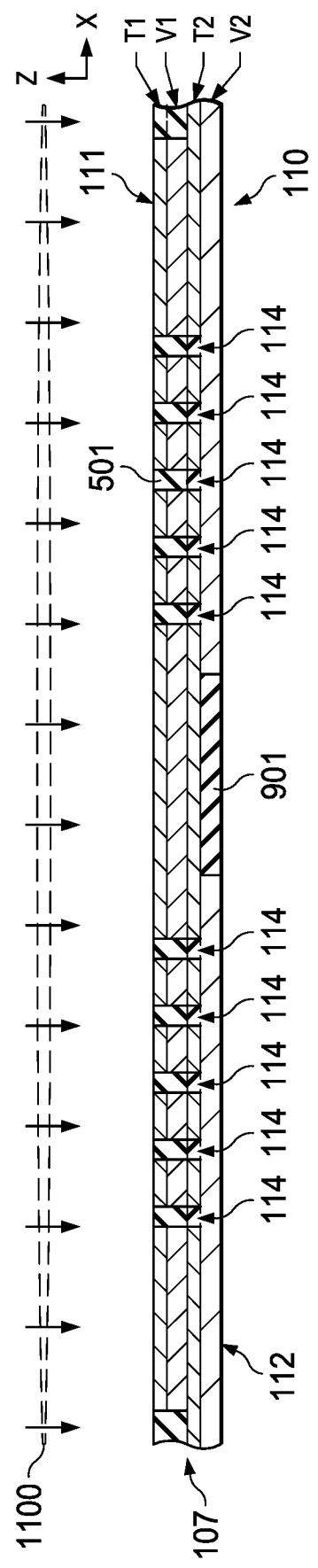

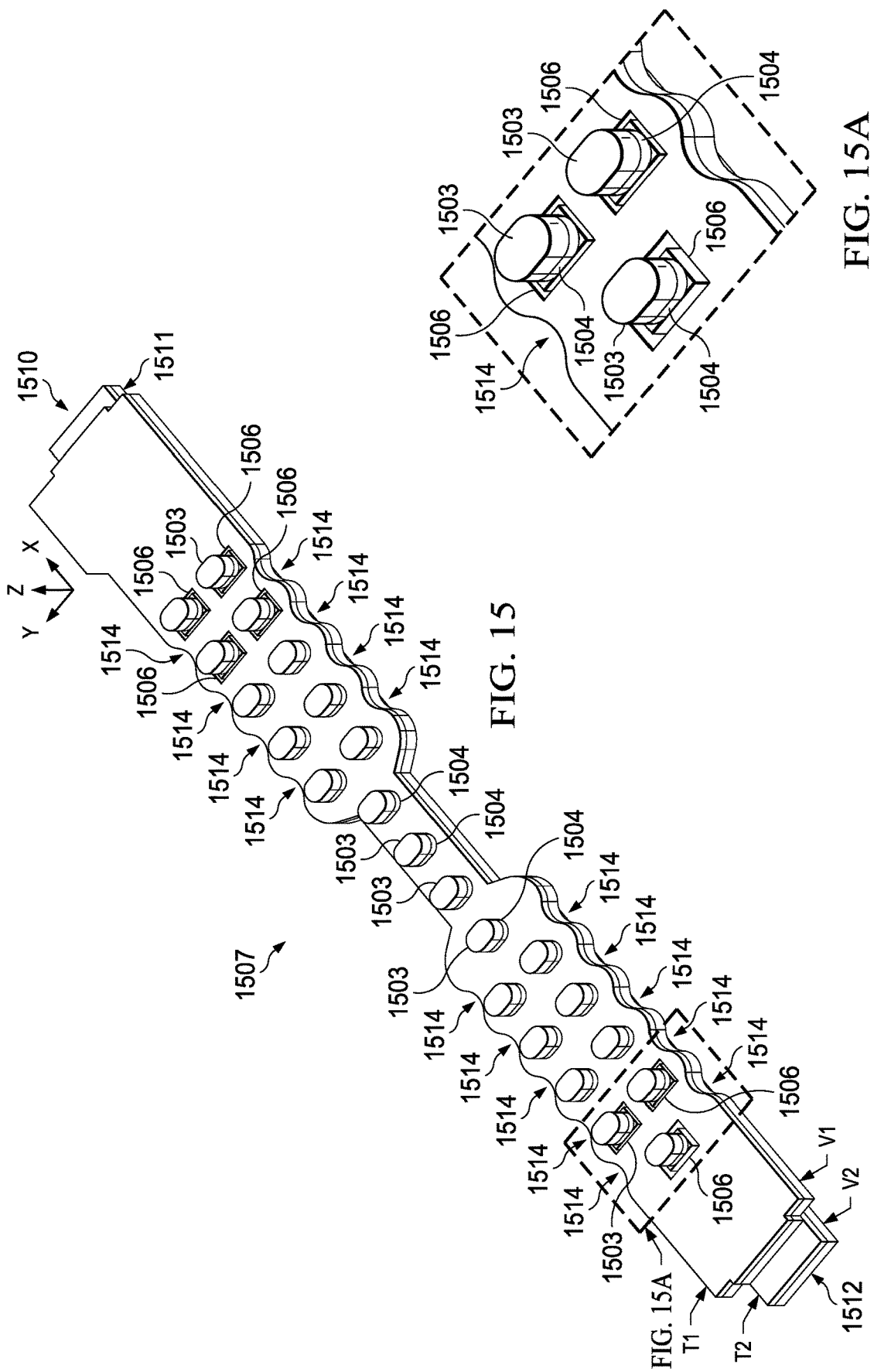

ELECTRONIC DEVICE MULTILEVEL PACKAGE SUBSTRATE FOR IMPROVED ELECTROMIGRATION PREFORMANCE

BACKGROUND

As the size of packaged electronic devices is reduced, power and current density increases. Higher current carrying capability can be improved by using large power posts, such as conductive bumps or pillars on a die, which are soldered to a lead frame. However, electromigration (EM) can cause adverse effects in high current packaged electronic devices where multiple die pillars or bumps are soldered to a lead frame. Coarse line spacing package design rules can lead to current crowding, high current density, and thermal hot spots at the solder/bump interface of certain die pillars or bumps. The high currents and temperatures of the solder interfaces can cause electromigration and lead to premature device performance degradation.

SUMMARY

In one aspect, an electronic device includes a multilevel package substrate, a die, and a package structure that encloses the die and a portion of the multilevel package substrate. The multilevel package substrate has a first level, a second level, a conductive structure, and conductive leads. The individual first and second levels have patterned conductive features and molded dielectric features. The first level extends in a plane of a first direction and an orthogonal second direction and includes a conductive first trace layer and a conductive first via layer. The first level has a first side with landing areas spaced apart from one another along the first direction. The die has conductive terminals electrically coupled to respective ones of the landing areas. The second level includes a conductive second trace layer and a conductive second via layer. The second trace layer is spaced apart from the first trace layer along a third direction that is orthogonal to the first and second directions. The conductive structure has a first end and a second end that is spaced apart from the first end along the first direction. The conductive structure includes conductive portions in the first and second levels that provide a conductive path along the first direction from the landing areas toward the second end. The conductive structure includes indents that extend into the conductive portions in the first level. The indents are spaced apart from one another along the first direction, and at least some of the indents are positioned along the first direction between respective pairs of the landing areas.

In another aspect, a multilevel package substrate includes first and second levels with patterned conductive features and molded dielectric features. The first level extends in a plane of a first direction and an orthogonal second direction and includes a conductive first trace layer and a conductive first via layer. The first level has a first side with landing areas spaced apart from one another along the first direction. The second level includes a conductive second trace layer and a conductive second via layer. The second trace layer is spaced apart from the first trace layer along a third direction that is orthogonal to the first and second directions. The multilevel package substrate includes a conductive structure having a first end and a second end that is spaced apart from the first end along the first direction. The conductive structure includes conductive portions in the first and second levels that provide a conductive path along the first direction from the landing areas toward the second end. The conductive structure includes indents that extend into the conductive portions in the first level. The indents are spaced apart from one another along the first direction, and the indents positioned along the first direction between respective pairs of the landing areas.

In a further aspect, a method for fabricating an electronic device includes fabricating a multilevel package substrate by forming a first level on a carrier structure. The first level has first patterned conductive features and first molded dielectric features and extends in a plane of a first direction and an orthogonal second direction, the first level includes a conductive first trace layer and a conductive first via layer. The first level has a first side with landing areas spaced apart from one another along the first direction. The method also includes forming a second level on the first level. The second level has second patterned conductive features and second molded dielectric features. The second level includes a conductive second trace layer and a conductive second via layer. The second trace layer is spaced apart from the first trace layer along a third direction that is orthogonal to the first and second directions. The method further includes forming a conductive structure in the first and second levels. The conductive structure has a first end and a second end that is spaced apart from the first end along the first direction. The conductive structure includes conductive portions in the first and second levels that provide a conductive path along the first direction from the landing areas toward the second end. The conductive structure includes indents that extend into the conductive portions in the first level. The indents are spaced apart from one another along the first direction, and the indents are positioned along the first direction between respective pairs of the landing areas. The method also includes removing the carrier structure from the first level, performing an electrical connection process that electrically couples conductive terminals of a die to respective ones of the landing areas, and performing a molding process that encloses the die and a portion of the multilevel package substrate in a package structure.

BRIEF DESCRIPTION OF THE DRAWINGS

FIG. 1A is a partial sectional side elevation view of the electronic device taken along line 1A-1A in FIG. 1.

FIG. 1B is a partial sectional side elevation view of the electronic device taken along line 1B-1B in FIG. 1.

FIGS. 3-13 are partial sectional side elevation views of the electronic device of FIG. 1 undergoing fabrication according to the method of FIG. 2.

FIG. 15 is a top perspective view of another conductive structure with top side moats in a multilevel package substrate.

FIG. 15A is a partial top perspective view of a portion of the multilevel package substrate of FIG. 15 showing example top side moats.

DETAILED DESCRIPTION

Figure 2:
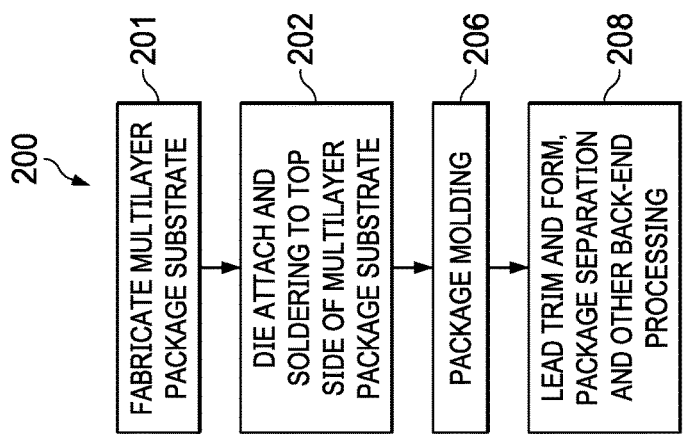
FIG. 2 is a flow diagram of a method for fabricating an electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1:
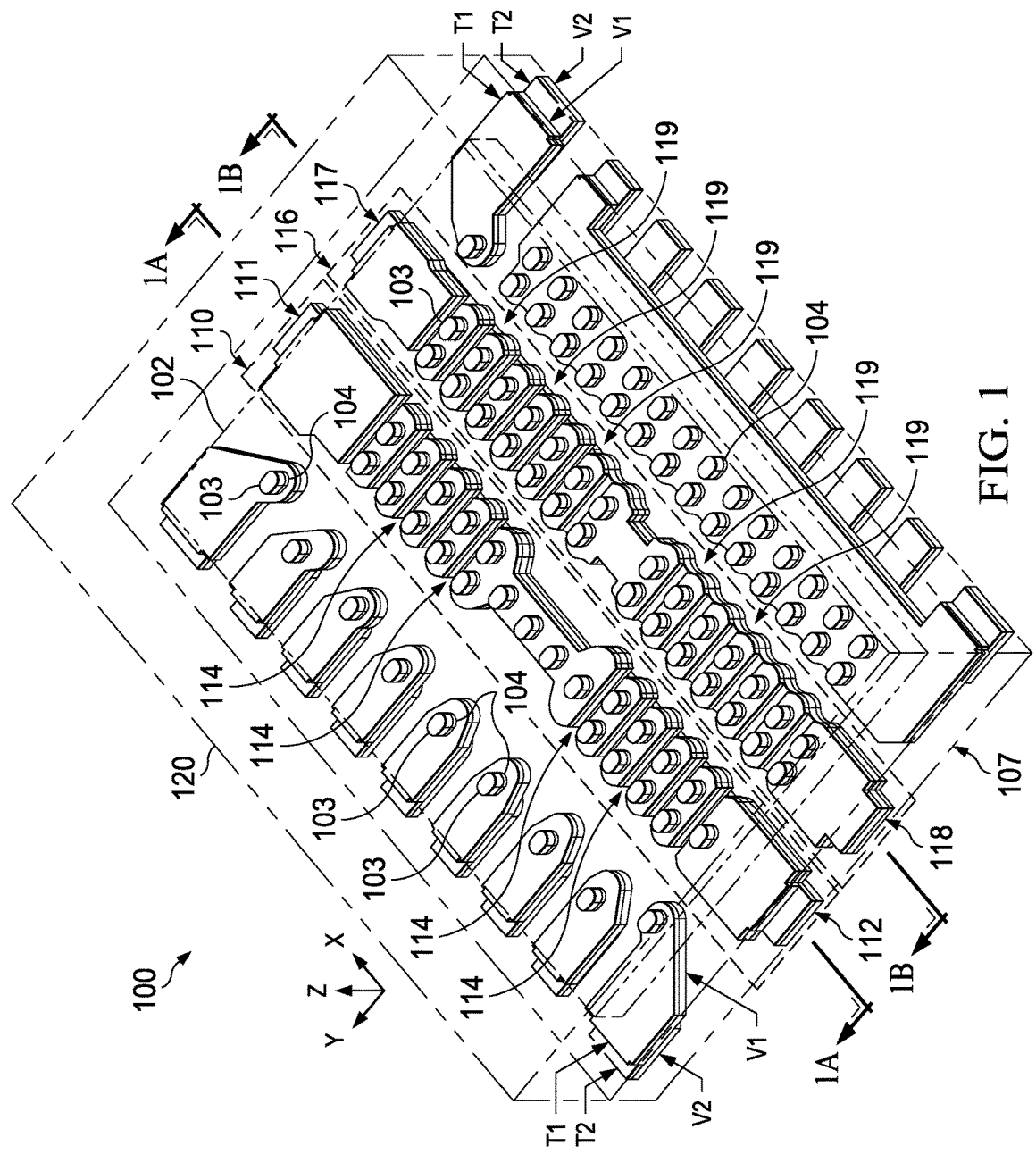
FIG. 1 is a top perspective view of a packaged electronic device that includes a multilevel package substrate with a conductive structure having top side slots in a multilevel package substrate.

Referring initially to FIGS. 1, 1A, and 1B, a packaged electronic device 100 includes a semiconductor die with conductive bumps or pillars soldered to landing areas of a multilevel package substrate. The multilevel package substrate includes a conductive structure with indents to mitigate electromigration by controlling current flowing to improve device performance and extend the device mean time to failure (MTTF). The electronic device 100 facilitates reduced electromigration effects by mitigating current crowding while allowing direct soldering of the conductive bumps or pillars of the die to the multilevel package substrate landing areas. This provides a low-cost solution compared to other approaches that use barrier metals such as nickel (Ni), nickel tungsten (NiW), etc. to avoid direct contact between copper (Cu) and tin (Sn). Another approach is to use tapered or pedestal lead frame features for solder connections to increase the area of the solder interface, but this approach also increases manufacturing cost and complexity compared to the described examples. The described examples facilitate the reduction in device size and cost while accommodating enhanced power and current density in packaged electronic devices and mitigating current crowding and thermal hot spots in conductive (e.g., copper) die posts and the interface with the solder at the connection to the multilevel package substrate.

Increased current density and resulting current and thermal hotspots can decrease the device mean time to failure per the following equation: $MTTF = A/J^n \exp(Ea/KT)$, where A is a geometry constant of the structure, J is the average current density, n is an empirically determined current density exponent (e.g., 2 to 3), Ea is the activation energy, K is the Boltzmann constant, and T is the device temperature. In one implementation, the landing areas of the multilevel package substrate in the electronic device are or include electroplated copper. The conductive features of the multilevel package substrate are designed with indented features to mitigate current crowding and electromigration in the die conductive terminals and the solder interface of the die terminals electrically coupled to respective ones of the landing areas.

FIG. 1 shows a top view of the packaged electronic device 100, FIG. 1A shows a sectional side view of the electronic device 100 taken along line 1A-1A in FIG. 1, and FIG. 1B shows a sectional side view taken along line 1B-1B in FIG. 1. The electronic device 100 includes a semiconductor die 102 having electronic components therein, such as transistors, resistors, capacitors, etc. that are interconnected in a circuit, with conductive terminals 103 electrically coupled by solder connections 104 to respective landing areas 105 (e.g., FIGS. 1A and 1B) of a multilevel package substrate 107. The multilevel package substrate 107 has a first level that includes a first trace layer T1 and a first via layer V1, as well as a second level that includes a second trace layer T2 and a second via layer V2. In other examples, the multilevel package substrate includes more than two levels. The first and second levels T1, V1 and T2, V2 each have patterned conductive features, such as copper, aluminum, or other conductive metal, as well as compression molded dielectric features between different conductive features and between adjacent levels. The molded dielectric features in one example are or include an electrically insulating dielectric material, where the thickness and material in the respective levels provide a withstanding voltage according to a desired voltage separation between circuits and components thereof for a given design.

The multilevel package substrate 107 also has conductive structures 110 and 116, as well as conductive leads with exposed lower surfaces to facilitate soldering to a host printed circuit board (PCB, not shown). The first level T1, V1 extends in a plane of a first direction (e.g., labeled X in the drawings) and an orthogonal second direction (e.g., labeled Y). The first level T1, V1 includes a conductive first trace layer T1 and a conductive first via layer V1. The first level T1, V1 has a first side (e.g., the top side of the first trace layer T1) with the landing areas 105. The landing areas 105 are spaced apart from one another along the first direction X. The second level T2, V2 includes a conductive second trace layer T2 and a conductive second via layer V2. The second trace layer T2 is spaced apart from (e.g., below) the first trace layer T1 along a third direction (e.g., labeled Z) that is orthogonal to the first and second directions X and Y.

In this example, the first conductive structure 110 has a first end 111 and a second end 112 that is spaced apart from the first end 111 along the first direction X. The second conductive structure 116 has a first end 117 and a second end 118 that is spaced apart from the first end 117 along the first direction X. The conductive structures 110 and 116 are generally straight and provide respective conductive paths generally parallel to the first direction X. In other examples, curved or curvilinear or piecewise linear shapes are possible. The individual conductive structures 110 and 116 include conductive portions in the first level T1, V1 and in the second level T2, V2 that provide a conductive path along the first direction X from the landing areas 105 toward the respective second ends 112 and 118.

The electronic device 100 also includes a package structure 120 that encloses the die 102 and a portion of the multilevel package substrate 107. In one example, the package structure 120 is or includes a molded material, such as plastic. In another example, the package structure 120 is or includes a ceramic material.

The first conductive structure 110 includes indents 114 that extend into the conductive portions in the first level T1, V1. The second conductive structure 116 in this example includes indents 119 that extend into the conductive portions in the first level T1, V1. The indents in this example are grooves or trenches that extend downward along the third direction Z (e.g., in the negative Z direction). In addition, the first and second conductive structures 110 and 116 in this example further include second indents that extend into the conductive structures 110 and 116 along the second direction Y, to provide lateral saw tooth shaped sidewalls as shown in FIG. 1.

As best shown in FIGS. 1A and 1B, some of the indents 114 and 119 in this example further extend into the conductive features in the second level T2, V2. For example, the groove indents 114 and 119 nearest to the respective first ends 111 and 117 extend through the first trace layer T1, the first via layer V1, and into or through the second trace layer T2. However, the groove indents 119 of the second conductive structure 116 nearest to the second end 118 extend through the first trace layer T1 and the first via layer V1, but do not extend through or into the second trace layer T2 or the second via layer V2. Any combination of groove indent depths (e.g., downward along the third direction Z) can be used in other implementations, and different indents 114, 119 can have different groove indent depths, and can be of any suitable profile, having straight portions, curved portions, or combinations thereof. The lateral (e.g., saw tooth) indents can be of different lengths (e.g., inward along the second direction Y), and can be of any suitable profile, having straight portions, curved portions, or combinations thereof.

Figure 14A:
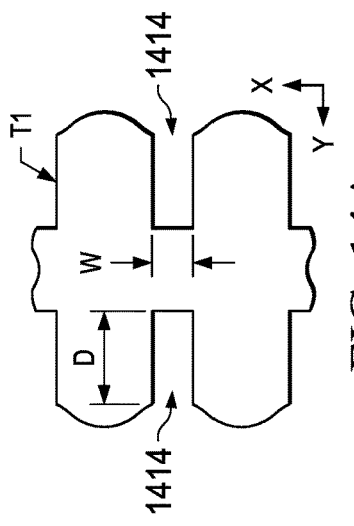
FIG. 14A is a partial top view of a portion of the multilevel package substrate of FIG. 14 showing example lateral indents.
Figure 14:
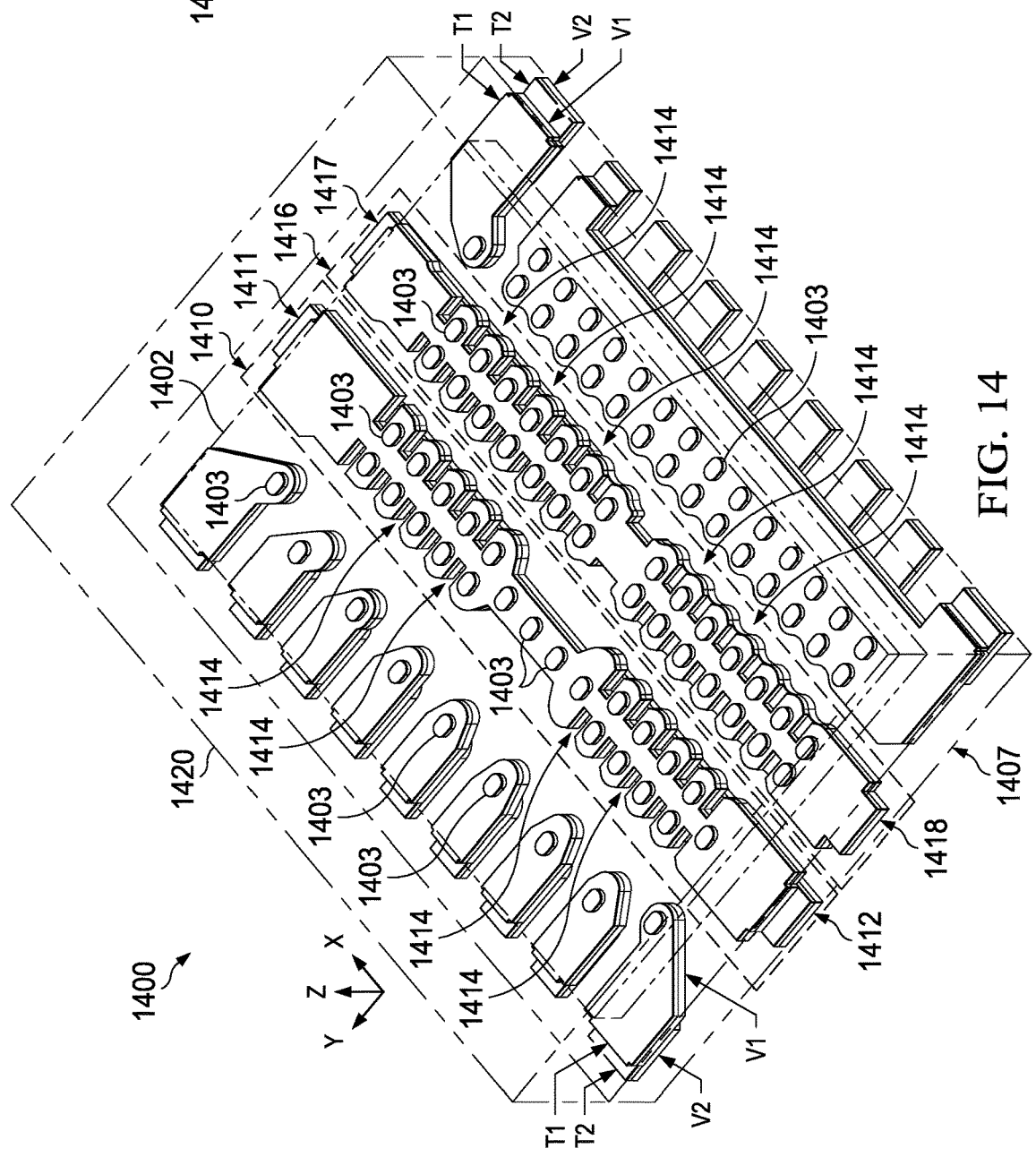
FIG. 14 is a top perspective view of another packaged electronic device having a conductive structure with lateral indents in a multilevel package substrate.
Figure 15B:
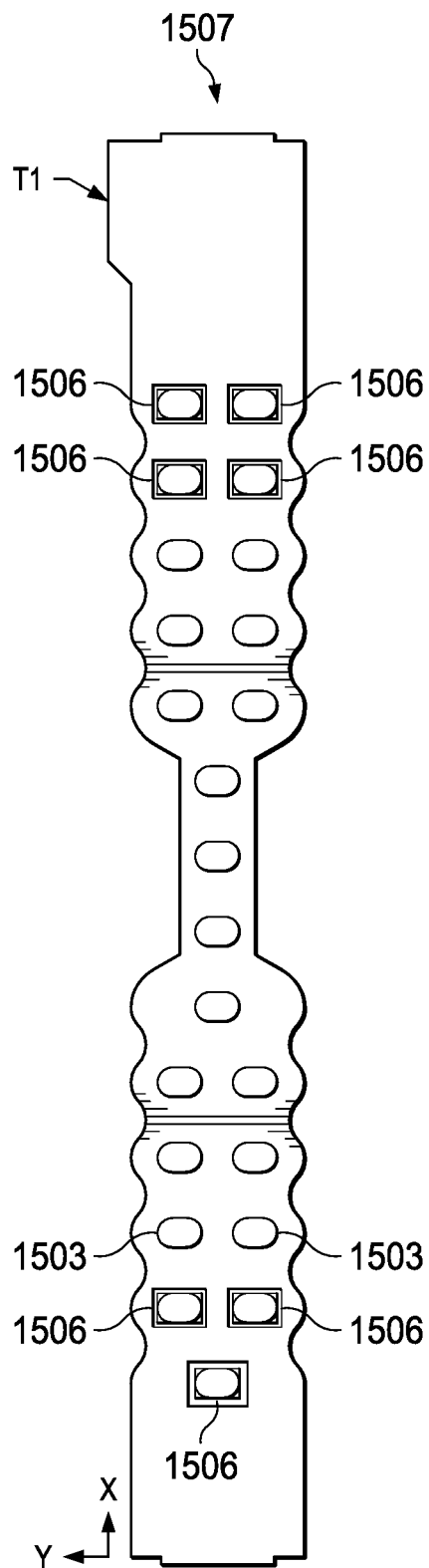
FIG. 15B is a top plan view of a first trace layer of the multilevel package substrate of FIG. 15 showing example top side moats.
Figure 15C:
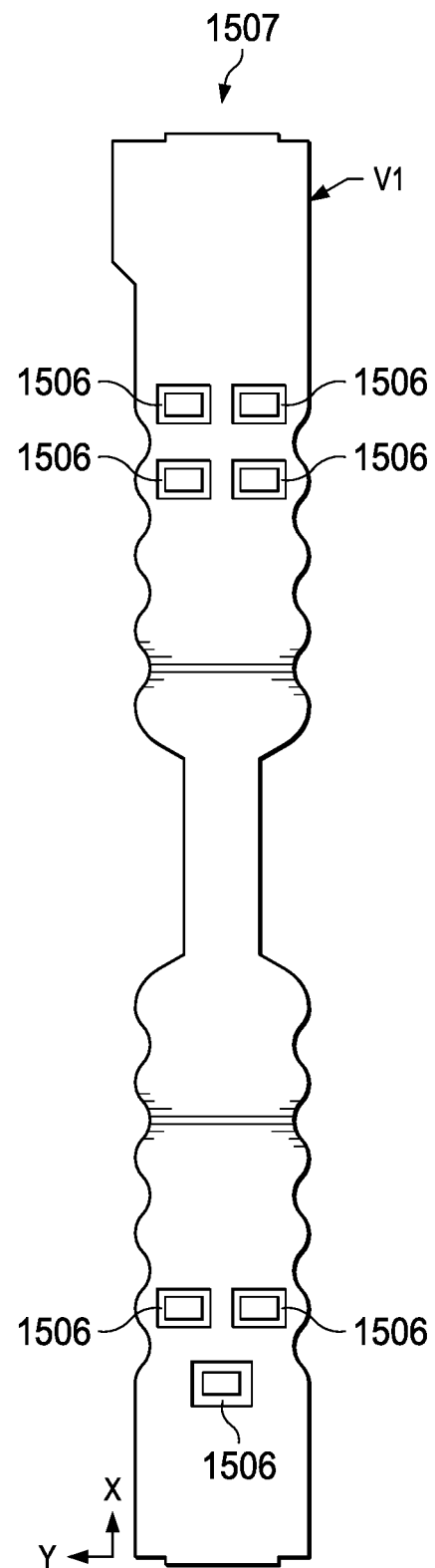
FIG. 15C is a top plan view of a first via layer of the multilevel package substrate of FIG. 15 showing example top side moats.

The groove indents 114 and 119 are spaced apart from one another along the first direction X. In addition, the indents 114 and 119 are positioned along the first direction X between respective pairs of the landing areas 105. This facilitates controlled current densities in the conductive structures 110 and 116 to mitigate current crowding and thermal hot spots in the conductive structures 110 and 116 and in the conductive terminals 103 and their interfaces with the solder connections 104 to the respective landing areas 105 of the multilevel package substrate 107. The conductive structures 110 and 116 in one example provide plated copper interconnect structures that facilitate much finer design rules compared to lead frame structures, and different implementations can be customized for different electromigration control applications. FIGS. 14-15E below show further example implementations using different indent features and combinations thereof.

FIG. 2 shows a method 200 for fabricating an electronic device, and FIGS. 3-13 show sectional side views of the electronic device 100 taken along line 1A-1A of FIG. 1 undergoing fabrication according to the method 200. At 201, the method 200 includes fabricating the multilevel package substrate 107. In one example, the multilevel package substrate fabrication at 201 includes forming the first level (e.g., T1, V1) on a carrier structure, and forming the second level (e.g., T2, V2) on the first level, after which the carrier structure is removed from the first level. The formation of the first and second levels in this example, concurrently forms the conductive structures 110 and 116 thereof, which are defined in the illustrated implementation by the plating masks used in electroplating operations detailed below.

Figure 3:
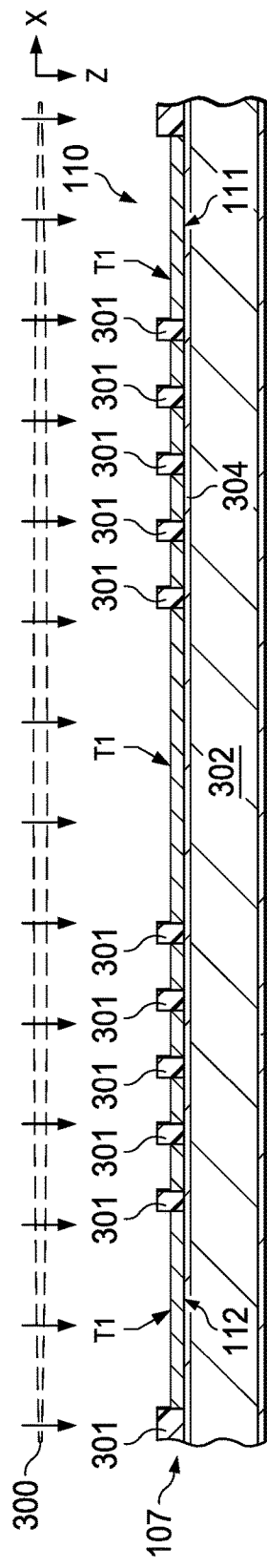

FIGS. 3-6 show formation of the first level T1, V1, for example, using an electroplating process 300 and a patterned plating mask 301. The illustrated example forms the first level having the first molded dielectric features, the first patterned conductive features, and the conductive leads of the eventual electronic device 100. The first level formation starts with forming the first trace layer T1 using a stainless-steel carrier 302, such as a panel or strip with multiple prospective package substrate sections, one of which is shown in FIG. 3. The carrier structure 302 includes thin copper seed layers 303 and 304 on the respective bottom and top sides of the carrier structure 302 to facilitate the electroplating process 300. The electroplating process 300 deposits copper onto the upper seed layer 304 in the portions of the topside of the carrier structure that are exposed through the patterned plating mask 301.

Figure 4:
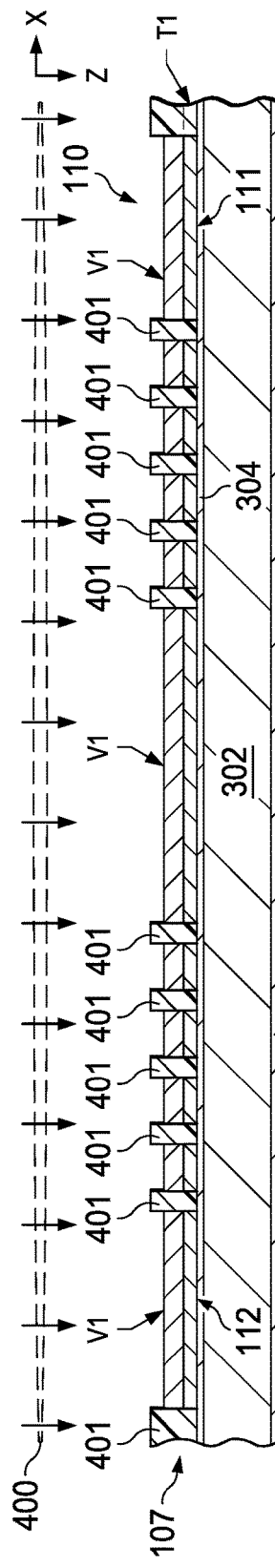

FIG. 4 shows the multilevel package substrate 107 after the process 300 is completed and the plating mask 301 has been removed. A second electroplating process 400 is performed in FIG. 4 using a patterned second plating mask 401 (e.g., a copper pillar plating process). The electroplating process 400 deposits further copper to form the first via layer V1 in the areas exposed by the second plating mask 401. After the process 400 is completed, the second plating mask 401 is removed.

Figure 5:
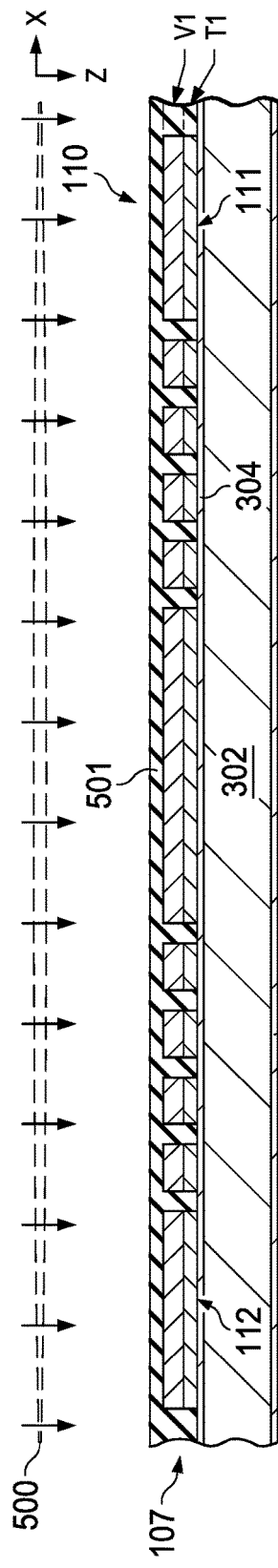
Figure 6:
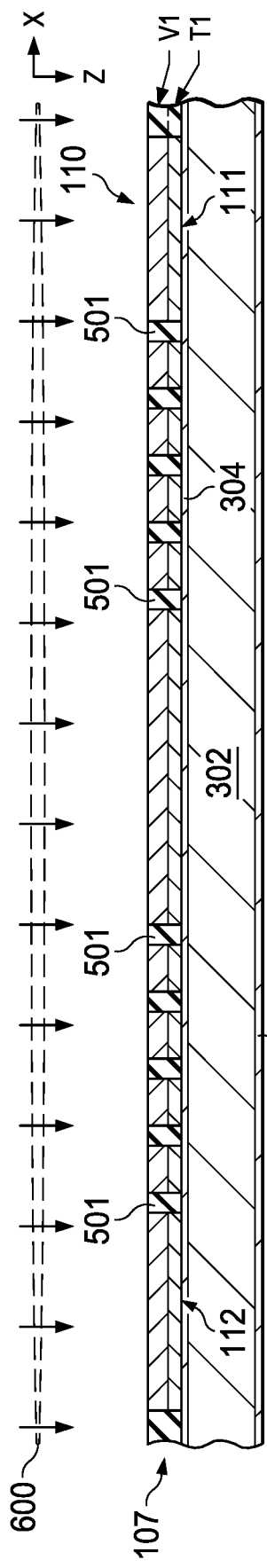

FIGS. 5 and 6 show the formation of the first molded dielectric features in the first level. A compression molding process 500 is performed in FIG. 5 that forms molded dielectric features 501 on exposed portions of the conductive features of the first trace layer T1 and the vias of the first via layer V1 to an initial thickness that covers the first trace layer T1 and the first via layer V1. A grinding process 600 is performed in FIG. 6, which grinds upper portions of the molded dielectric material 501 and exposes the upper portions of the first trace layer T1 and the first via layer V1. In another example, a chemical etch is used. In a further example, a chemical mechanical polishing process is used.

Figure 7:
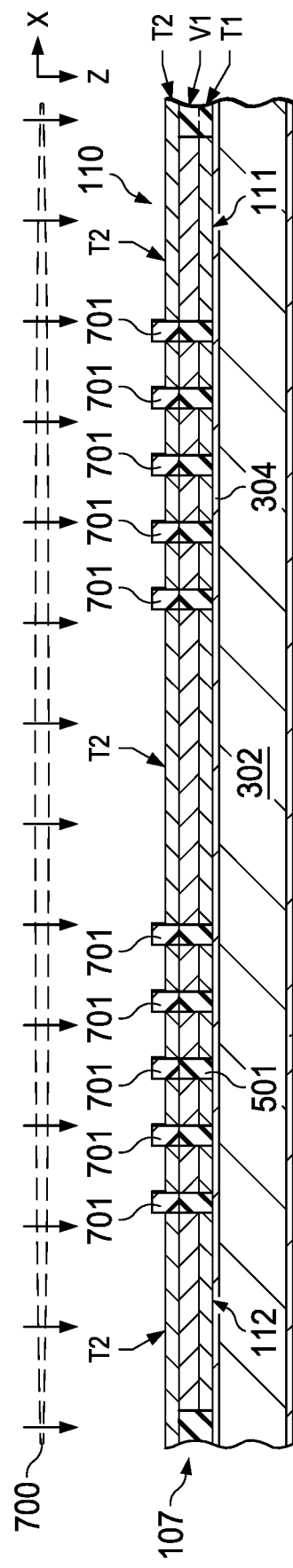

FIGS. 7-10 show formation of the second level of the multilevel package substrate 107, including forming the second trace layer T2, the second via layer V2 and the second molded dielectric features. In one example, the processing used to form the second level is similar to that used to form the first level, although not a requirement of all possible implementations. In the illustrated example, the second level processing forms the second level T2, V2 on the first level T1, V1, where the second level T2, V2 has the second patterned conductive features and second molded dielectric features. FIG. 7 shows the multilevel package substrate 107 undergoing an electroplating process 700 with a patterned plating mask 701. The electroplating process 700 deposits copper onto the top side of the portions of the finished first level that are exposed through the plating mask 701 to form the second trace layer. After the process 700 is completed, the plating mask 701 is removed. FIG. 8 shows the multilevel package substrate 107 undergoing another electroplating process 800 using another plating mask 801 (e.g., a copper pillar plating process). The electroplating process 800 deposits further copper to form the second via level V2 in the areas exposed by the plating mask 801. After the process 800 is completed, the plating mask 801 is removed.

FIGS. 9 and 10 show formation of the second molded dielectric features in the second level using compression molding and grinding. A compression molding process 900 is performed in FIG. 9, which forms molded dielectric features 901 on exposed portions of the second via layer V2 to an initial thickness that covers the second trace layer T2 and the second via layer V2. A grinding process 1000 is performed in FIG. 10, which grinds upper portions of the molded dielectric material 901 and exposes the upper portions of the second trace layer T2 and the second via layer V2. In another example, a chemical etch is used. In a further example, a chemical mechanical polishing process is used.

Figure 12:
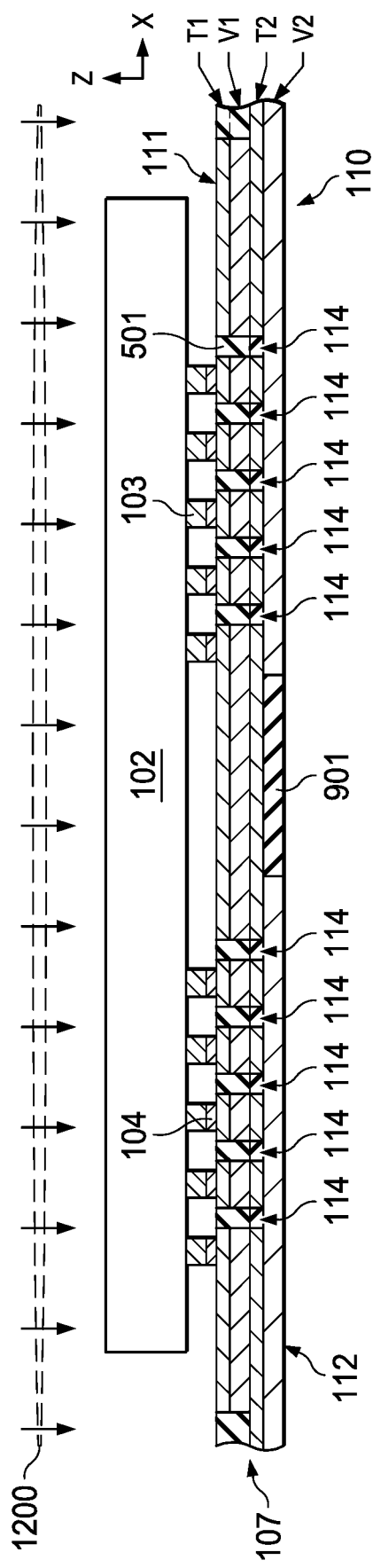

A process 1100 is performed in FIG. 11 that removes the carrier structure 302, 303, 304 from the first level T1, V1. This leaves the finished multilevel package substrate 107 as shown in FIG. 11. The method 200 in FIG. 2 also includes die attach and soldering at 202 via an electrical connection process 1200 in FIG. 12 that electrically couples the conductive terminals 103 of the semiconductor die 102 to respective ones of the landing areas 105 on the top side of the first trace layer T1. In FIG. 12, solder 104 is applied (e.g., dipped or otherwise deposited) onto the bottom sides of the conductive terminals 103 of the semiconductor die 102, and the semiconductor die 102 is placed with the respective terminals 103 on or over the respective landing areas 105 of the first trace layer T1. A thermal solder reflow process 1200 is performed that solders the die terminals 103 to the landing areas 105.

Figure 13:
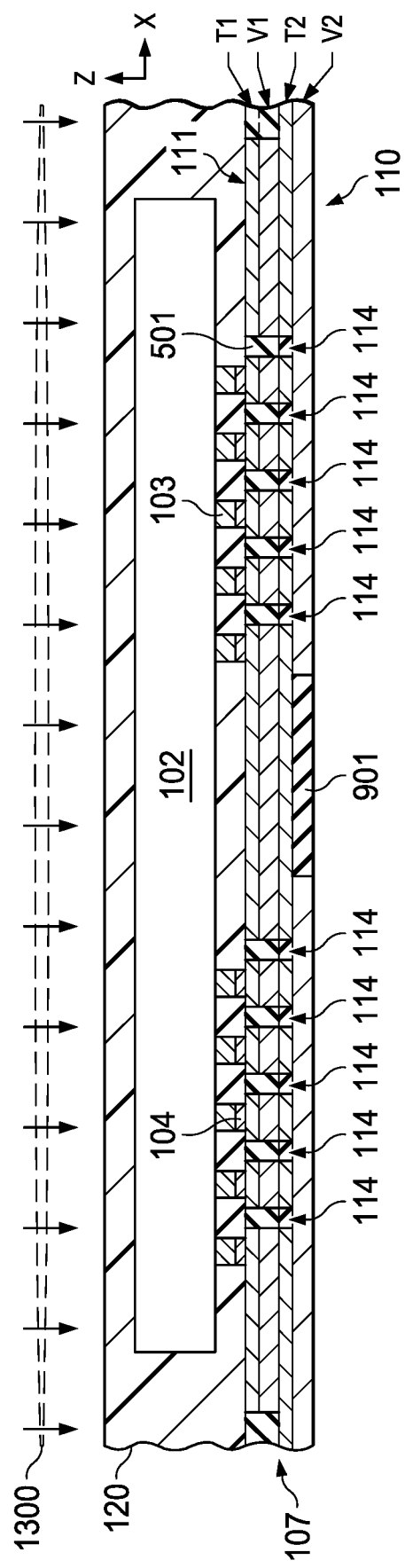

The method 200 continues at 206 in FIG. 2 with package molding. FIG. 13 shows one example, in which a molding process 1300 is performed that encloses a portion of the multilevel package substrate 107 and the die 102 in the package structure 120. A package separation process (not shown) is then performed at 208 in FIG. 2 (e.g., sawing, laser cutting, etc.) that separates individual packaged electronic devices 100 from a panel of concurrently processed devices, where FIG. 1 above shows the example finished electronic device 100.

In one example, the dielectric layers of the multilevel package substrate 107 are or include MJ1 ABF RLF dielectric material, and the package structure 120 is or includes Carsem/TITL mold compound. In one example, all or portions of the device leads are or include copper formed as described above as part of the multilevel package substrate fabrication processing. In another example, all or portions of the conductive leads are or include solder balls. In another example, the multilevel package substrate 107 is mounted to a die attach pad of a lead frame (now shown), which is then molded to provide a finished packaged electronic device.

FIG. 14 shows another packaged electronic device 1400 having conductive structures with lateral indents in a multilevel package substrate. The electronic device 1400 in this example has conductive structures 1410 and 1416 with lateral (e.g., saw tooth) indents 1414 that extend into the lateral sides of the conductive structures 1410 and 1416 along the second direction Y. FIG. 14A shows a top view of a portion of the multilevel package substrate of FIG. 14 with example lateral indent width dimensions W (e.g., 0.05 μm) and depth dimensions D (e.g., 0.11 μm). The electronic device 1400 in this example includes a semiconductor die 1402 having electronic components therein, such as transistors, resistors, capacitors, etc. that are interconnected in a circuit, with conductive terminals 1403 electrically coupled by solder connections (not numerically shown in FIG. 14, e.g., 104 in FIGS. 1-1B above) to respective landing areas (not numerically shown in FIG. 14, e.g., 105 in FIGS. 1A and 1B above) of a multilevel package substrate 1407.

The multilevel package substrate 1407 has a first level that includes a first trace layer T1 and a first via layer V1, as well as a second level that includes a second trace layer T2 and a second via layer V2. In other examples, the multilevel package substrate includes more than two levels. The first and second levels T1, V1 and T2, V2 each have patterned conductive features, such as copper, aluminum, or other conductive metal, as well as compression molded dielectric features between different conductive features and between adjacent levels. The molded dielectric features in one example are or include an electrically insulating dielectric material, where the thickness and material in the respective levels provide a withstanding voltage according to a desired voltage separation between circuits and components thereof for a given design.

The multilevel package substrate 1407 also includes the respective first and second conductive structures 1410 and 1416, as well as conductive leads with exposed lower surfaces to facilitate soldering to a host printed circuit board (PCB, not shown). The first level T1, V1 extends in a plane of a first direction (e.g., labeled X in FIGS. 14 and 14A) and an orthogonal second direction (e.g., labeled Y). The first level T1, V1 includes a conductive first trace layer T1 and a conductive first via layer V1. The first level T1, V1 has a first side (e.g., the top side of the first trace layer T1) with the landing areas. The landing areas are spaced apart from one another along the first direction X. The second level T2, V2 includes a conductive second trace layer T2 and a conductive second via layer V2. The second trace layer T2 is spaced apart from (e.g., below) the first trace layer T1 along a third direction (e.g., labeled Z) that is orthogonal to the first and second directions X and Y.

The first conductive structure 1410 has a first end 1411 and a second end 1412 that is spaced apart from the first end 1411 along the first direction X. The second conductive structure 1416 has a first end 1417 and a second end 1418 that is spaced apart from the first end 1417 along the first direction X. The conductive structures 1410 and 1416 are generally straight and provide respective conductive paths generally parallel to the first direction X. In other examples, curved or curvilinear or piecewise linear shapes are possible. The individual conductive structures 1410 and 1416 include conductive portions in the first level T1, V1 and in the second level T2, V2 that provide a conductive path along the first direction X from the landing areas toward the respective second ends 1412 and 1418. The electronic device 1400 also includes a package structure 1420 that encloses the die 1402 and a portion of the multilevel package substrate 1407. In one example, the package structure 1420 is or includes a molded material, such as plastic. In another example, the package structure 1420 is or includes a ceramic material.

The first conductive structure 1410 includes indents 1414 that extend into the conductive portions in the first level T1, V1. The second conductive structure 1416 in this example also includes indents 1414. The indents 1414 extend into the conductive portions in the first level T1, V1. The indents 1414 in this example extend laterally into the conductive structures 1410 and 1416 along the second direction Y, to provide lateral saw tooth shaped sidewalls as shown in FIG. 14. The indents 1414 in this example further extend into the conductive features in the second level T2, V2. For example, the indents 1414 extend through the first trace layer T1, the first via layer V1, and the second trace layer T2, and some extend into and through the second via layer V2. Any combination of groove indent depths (e.g., downward along the third direction Z) can be used in other implementations, and different indents 1414 can have different groove indent depths, and can be of any suitable profile, having straight portions, curved portions, or combinations thereof. In addition, the lateral (e.g., saw tooth) indents 1414 can be of different lengths (e.g., inward along the second direction Y), and can be of any suitable profile, having straight portions, curved portions, or combinations thereof.

The saw tooth indents 1414 are spaced apart from one another along the first direction X. In addition, at least some of the indents 1414 are positioned along the first direction X between respective pairs of the landing areas. This facilitates controlled current densities in the conductive structures 1410 and 1416 to mitigate current crowding and thermal hot spots in the conductive structures 1410 and 1416 and in the conductive terminals 1403 and their interfaces with the solder connections to the respective landing areas of the multilevel package substrate 1407. The conductive structures in one example provide plated copper interconnect structures that facilitate much finer design rules compared to lead frame structures, and different implementations can be customized for different electromigration control applications.

FIGS. 15-15E show a conductive structure portion 1510 in a multilevel package substrate 1507 of another example electronic device. This example includes top side moat indents 1506 in the conductive structure 1510. The moat indents 1506 create an island in the upper first level T1, V1 that includes an associated landing area to limit the current flow through select landing areas to better balance the current densities within the conductive structure 1510. The conductive structure 1510 in this example also has lateral (e.g., saw tooth) second indents 1514 that extend into the lateral sides of the conductive structure 1510 along the second direction Y. In another implementation, the lateral indents 1514 are omitted. FIG. 15A shows a portion of the multilevel package substrate 1507 with example top side moat indents 1506. FIG. 15B shows a first trace layer of the conductive structure 1510 with example top side moat indents 1506. FIG. 15C shows a first via layer of the conductive structure 1510 with example top side moat indents 1506. FIG. 15D shows a second trace layer of the conductive structure 1510 and FIG. 15E shows a second via layer of the conductive structure 1510.

The moat indents 1506 extend into the conductive structure 1510 along the third direction Z. In this example, the indents 1506 and 1514 extend through the first trace layer T1 along the third direction Z, and the moat indents 1514 laterally surround respective landing areas of the first trace layer T1. In the illustrated example, moat indents 1506 are provided around certain ones of the landing areas nearest to the ends 1511 and 1512, while interior landing areas of the conductive structure 1510 do not have moat indents (e.g., FIGS. 15B and 15C). In another example, more or fewer of the landing areas have associated moat indents 1506. Moreover, as shown in FIGS. 15B and 15C, different moat indents 1506 can have different lateral dimensions in an X-Y plane of the first and second directions. Furthermore, different moat indents 1506 can have different shapes/profiles in various implementations.

The conductive structure portion 1510 as shown is part of a multilevel package substrate 1507 to which a semiconductor die (not shown) is soldered, with conductive terminals 1503 of the die electrically coupled by solder connections 1504 to respective landing areas (not numerically shown in FIG. 15, e.g., 105 in FIGS. 1A and 1B above) of the multilevel package substrate 1507. The multilevel package substrate 1507 has a first level that includes the first trace layer T1 and a first via layer V1, as well as a second level that includes a second trace layer T2 and a second via layer V2. In other examples, the multilevel package substrate includes more than two levels. The first and second levels T1, V1 and T2, V2 each have patterned conductive features, such as copper, aluminum, or other conductive metal, as well as compression molded dielectric features between different conductive features and between adjacent levels. The molded dielectric features in one example are or include an electrically insulating dielectric material, where the thickness and material in the respective levels provide a withstanding voltage according to a desired voltage separation between circuits and components thereof for a given design.

The multilevel package substrate 1507 also includes the conductive structure 1510 as well as conductive leads (not shown) with exposed lower surfaces to facilitate soldering to a host printed circuit board (PCB, now shown). The first level T1, V1 extends in a plane of a first direction (e.g., labeled X in FIG. 15) and an orthogonal second direction (e.g., labeled Y). The first level T1, V1 includes the conductive first trace layer T1 and a conductive first via layer V1. The first level T1, V1 has a first side (e.g., the top side of the first trace layer T1) with the landing areas. The landing areas are spaced apart from one another along the first direction X. The second level T2, V2 includes a conductive second trace layer T2 and a conductive second via layer V2. The second trace layer T2 is spaced apart from (e.g., below) the first trace layer T1 along a third direction (e.g., labeled Z) that is orthogonal to the first and second directions X and Y.

The conductive structure 1510 has a first end 1511 and a second end 1512 that is spaced apart from the first end 1511 along the first direction X. The conductive structure 1510 is generally straight and provides a conductive path generally parallel to the first direction X. In other examples, curved or curvilinear or piecewise linear shapes are possible. The conductive structure 1510 includes conductive portions in the first level T1, V1 and in the second level T2, V2 that provide a conductive path along the first direction X from the landing areas toward the second end 1512. The electronic device 1500 also includes a package structure (not shown, e.g., 120 in FIG. 1 above) that encloses the die and a portion of the multilevel package substrate 1507. In one example, the package structure is or includes a molded material, such as plastic. In another example, the package structure is or includes a ceramic material.

Figure 15D:
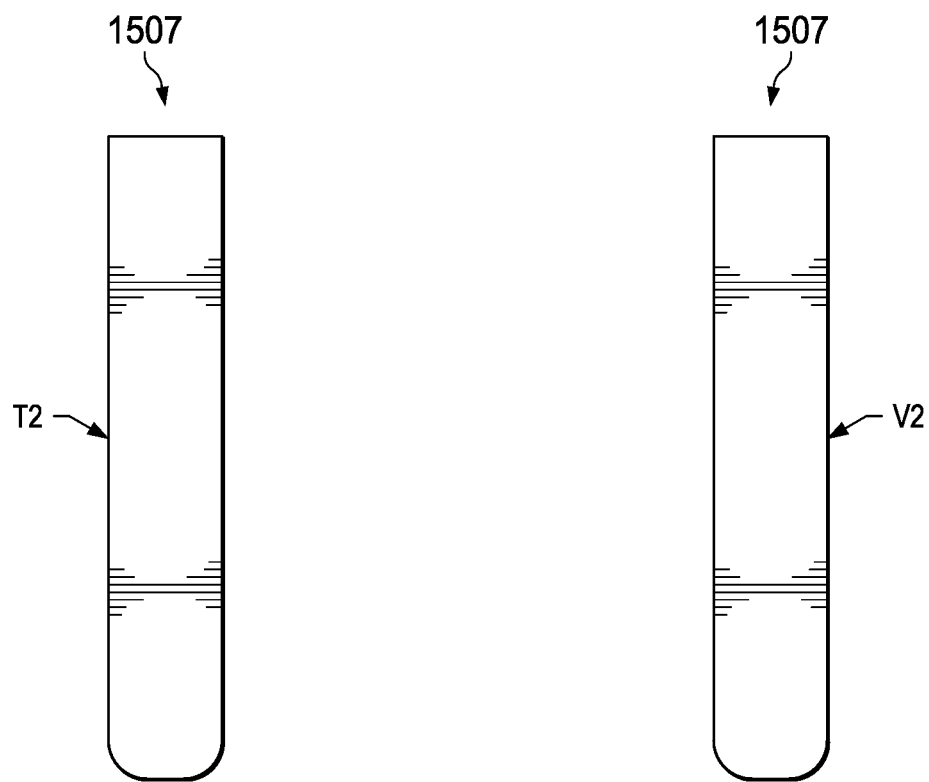
FIG. 15D is a top plan view of a second trace layer of the multilevel package substrate of FIG. 15.
Figure 15E:
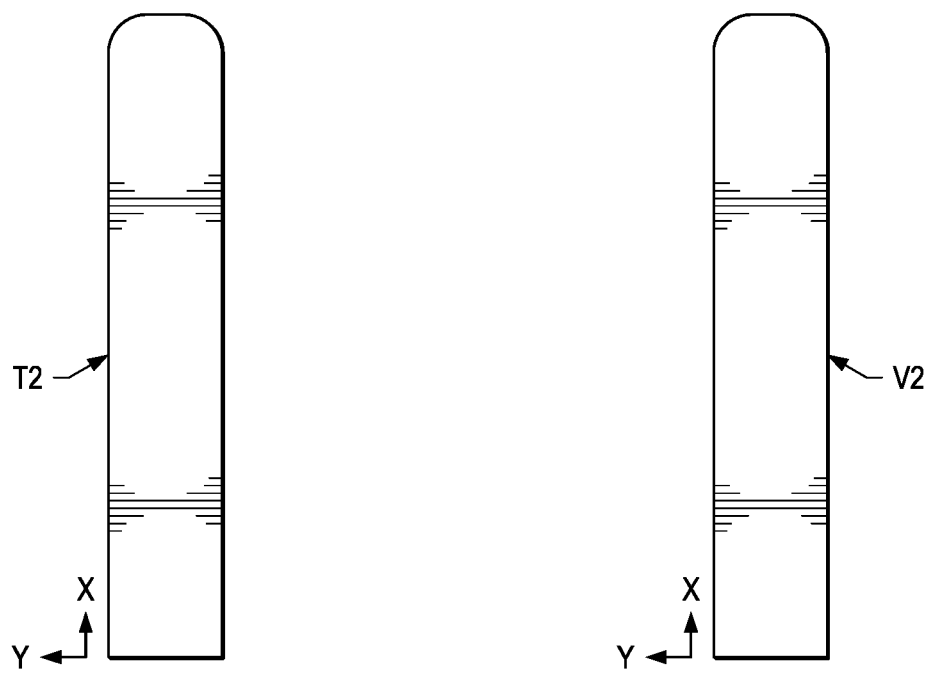
FIG. 15E is a top plan view of a second via layer of the multilevel package substrate of FIG. 15.

As further shown in FIGS. 15B-15E, the moat indents 1506 extend downward along the third direction Z into the conductive portions in the first level T1, V1 (e.g., FIGS. 15B and 15C), but do not extend into the second level T2, V2 (FIGS. 15D and 15E). The lateral second indents 1514 extend along the second direction Y into the conductive portions in the first level T1, V1 (e.g., FIGS. 15B and 15C) to provide partially lateral saw tooth shaped upper sidewalls, but do not extend into the second level T2, V2 (FIGS. 15D and 15E). Any combination of moat indent depths and saw tooth indent depths (e.g., downward along the third direction Z) can be used in other implementations, and different indents 1506 and/or 1514 can have different lateral dimensions and shapes, and the indents 1506 and 1514 can be of any suitable profile (e.g., having straight portions, curved portions, or combinations thereof).

The moat indents 1506 and saw tooth indents 1514 in this example are spaced apart from one another along the first direction X. In addition, at least some of the indents 1514 are positioned along the first direction X between respective pairs of the landing areas. The moat indents 1506, whether alone or in combination with the lateral saw tooth indents 1514 help control current densities to enhance current density uniformity and mitigate crowding and hot spots in the conductive structure 1510 as well as in the conductive terminals 1503 and their interfaces with the solder connections to the respective landing areas of the multilevel package substrate 1507. The illustrated examples facilitate current density uniformity and reduced electromigration to extend product device lifetime and combat performance degradation, while supporting higher power and current density as electronic device package sizes are reduced. For transistor device examples, the described examples facilitate balanced, uniform current density while maintaining acceptable transistor current flow with little or no adverse impact on device on-state resistance (e.g., Rdson).

Modifications are possible in the described examples, and other implementations are possible, within the scope of the claims.

What is claimed is:

1. An electronic device, comprising:
   a multilevel package substrate having a first level, a second level, a conductive structure, and conductive leads;
   the first and second levels each having patterned conductive features and molded dielectric features;
   the first level extending in a plane of a first direction and an orthogonal second direction, the first level including a conductive first trace layer and a conductive first via layer, the first level having a first side with landing areas spaced apart from one another along the first direction;
   the second level including a conductive second trace layer and a conductive second via layer, the second trace layer spaced apart from the first trace layer along a third direction that is orthogonal to the first and second directions;
   the conductive structure having a first end and a second end that is spaced apart from the first end along the first direction, the conductive structure including conductive portions in the first and second levels that provide a conductive path along the first direction from the landing areas toward the second end;
   the conductive structure including indents that extend into the conductive portions in the first level, the indents spaced apart from one another along the first direction, and the indents positioned along the first direction between respective pairs of the landing areas;
   a die having conductive terminals electrically coupled to respective ones of the landing areas; and
   a package structure that encloses the die and a portion of the multilevel package substrate.

2. The electronic device of claim 1, wherein the indents extend into the conductive features in the second level.

3. The electronic device of claim 2, wherein the indents extend into the conductive structure along the third direction.

4. The electronic device of claim 3, wherein the indents extend through the conductive portions in the first level.

5. The electronic device of claim 3, wherein:
   the indents extend through the first trace layer along a third direction; and
   the indents laterally surround the landing areas.

6. The electronic device of claim 3, wherein the conductive structure further includes second indents that extend into the conductive structure along the second direction.

7. The electronic device of claim 2, wherein the indents extend into the conductive structure along the second direction.

8. The electronic device of claim 1, wherein the indents extend into the conductive structure along the third direction.

9. The electronic device of claim 8, wherein the indents extend through the conductive portions in the first level.

10. The electronic device of claim 8, wherein:
    the indents extend through the first trace layer along a third direction; and
    the indents laterally surround the landing areas.

11. The electronic device of claim 1, wherein the indents extend into the conductive structure along the second direction.

12. A multilevel package substrate, comprising:
    a first level;
    a second level; and
    a conductive structure;
    the first and second levels each having patterned conductive features and molded dielectric features;
    the first level extending in a plane of a first direction and an orthogonal second direction, the first level including a conductive first trace layer and a conductive first via layer, the first level having a first side with landing areas spaced apart from one another along the first direction, the landing areas adapted to be soldered to conductive terminals of a die;
    the second level including a conductive second trace layer and a conductive second via layer, the second trace layer spaced apart from the first trace layer along a third direction that is orthogonal to the first and second directions;
    the conductive structure having a first end and a second end that is spaced apart from the first end along the first direction, the conductive structure including conductive portions in the first and second levels that provide a conductive path along the first direction from the landing areas toward the second end; and
    the conductive structure including indents that extend into the conductive portions in the first level, the indents spaced apart from one another along the first direction, and the indents positioned along the first direction between respective pairs of the landing areas.

13. The multilevel package substrate of claim 12, wherein the indents extend into the conductive features in the second level.

14. The multilevel package substrate of claim 13, wherein the indents extend into the conductive structure along the second direction.

15. The multilevel package substrate of claim 12, wherein the indents extend into the conductive structure along the third direction.

16. The multilevel package substrate of claim 15, wherein the indents extend through the conductive portions in the first level.

17. The multilevel package substrate of claim 15, wherein:
    the indents extend through the first trace layer along a third direction; and
    the indents laterally surround the landing areas.

18. The multilevel package substrate of claim 12, wherein the indents extend into the conductive structure along the second direction.

19. A method for fabricating an electronic device, the method comprising:
    fabricating a multilevel package substrate, including:
        forming a first level on a carrier structure, the first level having first patterned conductive features and first molded dielectric features, the first level extending in a plane of a first direction and an orthogonal second direction, the first level including a conductive first trace layer and a conductive first via layer, the first level having a first side with landing areas spaced apart from one another along the first direction;
        forming a second level on the first level, the second level having second patterned conductive features and second molded dielectric features, the second level including a conductive second trace layer and a conductive second via layer, the second trace layer spaced apart from the first trace layer along a third direction that is orthogonal to the first and second directions;

forming a conductive structure in the first and second levels, the conductive structure having a first end and a second end that is spaced apart from the first end along the first direction, the conductive structure including conductive portions in the first and second levels that provide a conductive path along the first direction from the landing areas toward the second end, the conductive structure including indents that extend into the conductive portions in the first level, and the indents spaced apart from one another along the first direction, and the indents positioned along the first direction between respective pairs of the landing areas; and removing the carrier structure from the first level;

performing an electrical connection process that electrically couples conductive terminals of a die to respective ones of the landing areas; and performing a molding process that encloses the die and a portion of the multilevel package substrate in a package structure.

20. The method of claim 19, wherein the electrical connection process includes soldering the conductive terminals of the die to respective ones of the landing areas.

\* \* \* \* \*